(12) United States Patent
Gage et al.

(10) Patent No.: US 8,288,288 B1
(45) Date of Patent: Oct. 16, 2012

(54) TRANSFERRING HEAT IN LOADLOCKS

(75) Inventors: Christopher Gage, Campbell, CA (US); Lee Peng Chua, Beaverton, OR (US)

(73) Assignee: Novellus Systems, Inc., San Jose, CA (US)

( * ) Notice: Subject to any disclaimer, the term of this patent is extended or adjusted under 35 U.S.C. 154(b) by 1156 days.

(21) Appl. No.: 12/140,196

(22) Filed: Jun. 16, 2008

(51) Int. Cl.
*H01L 21/00* (2006.01)

(52) U.S. Cl. .......................... 438/715; 34/408; 414/217

(58) Field of Classification Search .................. 438/715; 34/15, 408
See application file for complete search history.

(56) References Cited

U.S. PATENT DOCUMENTS

| | | | |
|---|---|---|---|
| 3,612,825 A | 10/1971 | Chase et al. | |
| 4,563,589 A | 1/1986 | Scheffer | |
| 4,960,488 A | 10/1990 | Law et al. | |
| 5,178,682 A | 1/1993 | Tsukamoto et al. | |
| 5,228,208 A | 7/1993 | White et al. | |
| 5,282,121 A | 1/1994 | Bornhorst et al. | |
| 5,308,989 A | 5/1994 | Brubaker | |
| 5,558,717 A | 9/1996 | Zhao et al. | |
| 5,909,994 A | 6/1999 | Blum et al. | |
| 6,106,625 A | 8/2000 | Koai et al. | |
| 6,228,438 B1 | 5/2001 | Schmitt | |
| 6,307,184 B1 | 10/2001 | Womack et al. | |
| 6,320,736 B1* | 11/2001 | Shamouilian et al. | 361/234 |
| 6,394,797 B1 | 5/2002 | Sugaya et al. | |
| 6,467,491 B1 | 10/2002 | Sugiura et al. | |
| 6,518,195 B1 | 2/2003 | Collins et al. | |
| 6,559,424 B2 | 5/2003 | O'Carroll et al. | |
| 6,563,092 B1 | 5/2003 | Shrinivasan et al. | |
| 6,860,965 B1 | 3/2005 | Stevens | |
| 6,899,765 B2 | 5/2005 | Krivts et al. | |
| 7,105,463 B2 | 9/2006 | Kurita et al. | |
| 7,253,125 B1 | 8/2007 | Bandyopadhyay et al. | |
| 7,265,061 B1 | 9/2007 | Cho et al. | |
| 7,327,948 B1 | 2/2008 | Shrinivasan et al. | |
| 7,422,406 B2 | 9/2008 | van der Meulen | |
| 7,665,951 B2 | 2/2010 | Kurita et al. | |
| 7,845,891 B2 | 12/2010 | Lee et al. | |

(Continued)

FOREIGN PATENT DOCUMENTS

JP 01-107519 4/1989

(Continued)

OTHER PUBLICATIONS

Shrinivasan et al., "Single-Chamber Sequential Curing of Semiconductor Wafers," Novellus Systems, Inc., U.S. Appl. No. 11/115,576, filed Apr. 26, 2005.

(Continued)

*Primary Examiner* — Shamim Ahmed
(74) *Attorney, Agent, or Firm* — Weaver Austin Villeneuve & Sampson LLP

(57) ABSTRACT

Methods that increase the overall rate of heat transfer between a substrate and a heat sink or source, e.g., in a loadlock are provided. According to various embodiments, the methods involve varying the heat transfer coefficient of a heat transfer gas in the loadlock or other chamber. The heat transfer coefficient is varied to reduce the time-dependent variation of the rate of heat transfer. As a result, the overall rate of heat transfer is improved. In certain embodiments, the methods involve varying the gas pressure of a chamber in order to affect the rate of heat transfer to a wafer within a system. By manipulating the gas pressure accordingly, the rate of heat transfer is controlled throughout the heating or cooling cycle.

18 Claims, 12 Drawing Sheets

U.S. PATENT DOCUMENTS

| | | |
|---|---|---|
| 8,033,769 B2 | 10/2011 | Gage et al. |
| 8,033,771 B1 | 10/2011 | Gage et al. |
| 2002/0005168 A1 | 1/2002 | Kraus et al. |
| 2002/0033136 A1 | 3/2002 | Savage et al. |
| 2002/0117109 A1 | 8/2002 | Hazelton et al. |
| 2002/0162630 A1 | 11/2002 | Satoh et al. |
| 2003/0013280 A1 | 1/2003 | Yamanaka |
| 2004/0023513 A1 | 2/2004 | Aoyama et al. |
| 2004/0183226 A1 | 9/2004 | Newell et al. |
| 2004/0194268 A1 | 10/2004 | Halsey et al. |
| 2005/0226793 A1* | 10/2005 | Sakakura et al. ............. 422/211 |
| 2005/0258164 A1 | 11/2005 | Hiramatsu et al. |
| 2006/0075960 A1* | 4/2006 | Borgini et al. ................ 117/200 |
| 2006/0245852 A1 | 11/2006 | Iwabuchi |
| 2007/0205788 A1 | 9/2007 | Natsuhara et al. |
| 2007/0243057 A1 | 10/2007 | Shimada et al. |
| 2009/0142167 A1 | 6/2009 | Gage et al. |
| 2011/0318142 A1 | 12/2011 | Gage et al. |
| 2012/0003063 A1 | 1/2012 | Gage et al. |

FOREIGN PATENT DOCUMENTS

| | | |
|---|---|---|
| JP | 06-037054 | 2/1994 |
| JP | 07-147274 | 6/1995 |
| JP | 2005-116655 | 4/2005 |
| KR | 10-2003-0096732 | 12/2003 |
| WO | 00/60414 | 10/2000 |

OTHER PUBLICATIONS

U.S. Office Action mailed Oct. 3, 2007, from U.S. Appl. No. 11/115,576.

U.S. Final Office Action mailed May 2, 2008, from U.S Appl. No. 11/115,576.

U.S. Office Action mailed Oct. 17, 2008, from U.S. Appl. No. 11/115,576.

Shrinivasan et al., "Pedestal Heat Transfer and Temperature Control," Novellus Systems, Inc., U.S. Appl. No. 11/851,310, filed Sep. 6, 2007.

Doble et al., "Concave Pedestal for Uniform Heating of Silicon Wafers," Novellus Systems, Inc., U.S. Appl. No. 11/546,189, filed Oct. 10, 2006.

Landess et al., "Tailored Profile Pedestal for Therm-Elastically Stable Cooling or Heating of Substrates," Novellus Systems, Inc., U.S. Appl. No. 11/129,266, filed May 12, 2005, pp. 1-25.

U.S. Office Action mailed Jun. 16, 2008, from U.S. Appl. No. 11/546,189.

U.S. Final Office Action mailed Oct. 16, 2008, from U.S. Appl. No. 11/546,189.

U.S. Office Action mailed Jul. 18, 2006, from U.S. Appl. No. 11/184,101.

Notice of Allowance and Fee Due mailed Jan. 25, 2007, from U.S. Appl. No. 11/184,101.

Allowed Claims from U.S. Appl. No. 11/184,101.

Rivkin et al., "Load Lock Design for Rapid Wafer Handling," Novellus Systems, Inc., U.S. Appl. No. 11/608,185, filed Dec. 7, 2006.

Nordin et al., "Closed Loop Temperature Heat Up and Control Utilizing Wafer-To-Heater Pedestal Gap Modulation," Novellus Systems, Inc., U.S. Appl. No. 11/937,364, filed Nov. 8, 2007.

Rivkin et al., "Photoresist Stripping Method and Apparatus," Novellus Systems, Inc., U.S. Appl. No. 61/050,880, filed May 6, 2008.

Gage et al., "Minimum Contact Area Wafer Clamping with Gas Flow for Rapid Wafer Cooling," Novellus Systems, Inc., U.S. Appl. No. 12/333,239, filed Dec. 11, 2008.

Gage et al., "Transferring Heat in Loadlocks," Novellus Systems, Inc., U.S. Appl. No. 12/140,196, filed Jun. 16, 2008.

Gage et al., "Minimum Contact Area Wafer Clamping With Gas Flow for Rapid Wafer Cooling" Novellus Systems, Inc., U.S. Appl. No. 12/333,239, filed Dec. 11, 2008.

International Search Report and Written Opinion dated Aug. 2, 2010, from Application No. PCT/US2009/067040.

U.S. Office Action mailed Dec. 27, 2010, from U.S Appl. No. 12/333,239.

U.S. Office Action mailed Dec. 14, 2010 for U.S. Appl. No. 11/998,528.

U.S. Final Office Action mailed Mar. 9, 2011, from U.S. Appl. No. 12/333,239.

U.S. Final Office Action mailed Apr. 7, 2011 from U.S. Appl. No. 11/998,528.

Notice of Allowance mailed Jun. 27, 2011, from U.S. Appl. No. 12/333,239.

Allowed Claims as of Jun. 27, 2011 from U.S. Appl. No. 12/333,239.

Notice of Allowance Action mailed Jun. 14, 2011 from U.S. Appl. No. 11/998,528.

Allowed Claims as of Jun. 14, 2011 from U.S. Appl. No. 11/998,528.

Gage et al., "Loadlock Designs and Methods for Using Same" Novellus Systems, Inc., U.S. Appl. No. 13/229,497, filed Sep. 9, 2011.

Gage et al., "Minimum Contact Area Wafer Clamping With Gas Flow for Rapid Wafer Cooling" Novellus Systems, Inc., U.S. Appl. No. 13/227,160, filed Sep. 7, 2011.

* cited by examiner ps://example.com

TRANSFERRING HEAT IN LOADLOCKS

BACKGROUND

Different types of tools are used to perform hundreds of processing operations during semiconductor device fabrication. Most of these operations are performed in vacuum chambers at very low pressure. Wafers are introduced to the process chambers with wafer handling systems that are mechanically coupled to the process chambers. The wafer handling systems transfer wafers from the factory floor to the process chamber. These systems include loadlocks to bring the wafers from atmospheric conditions to very low pressure conditions and back, and robots to transfer the wafers to various positions. In many apparatuses, wafers are heated or cooled in a loadlock. For example, after processing, hot wafers may be placed in a loadlock for cooling as well as repressurization. Throughput—the number of wafers processed in a period of time—is affected by the process time as well as the number of wafers that are processed at a time. What are needed are improved methods and apparatuses of increasing throughput.

SUMMARY

The present invention provides methods that improve the overall rate of heat transfer between a substrate and a heat sink or source, e.g., in a loadlock. According to various embodiments, the methods involve varying the heat transfer coefficient of a heat transfer gas in the loadlock or other chamber. The heat transfer coefficient is varied to reduce the time-dependent variation of the rate of heat transfer. As a result, the overall rate of heat transfer is improved. In certain embodiments, the methods involve varying the gas pressure of a chamber in order to affect the rate of heat transfer to a wafer within a system. By manipulating the gas pressure accordingly, the rate of heat transfer is controlled throughout the heating or cooling cycle. In the initial stages of a heating or cooling cycle, the rate of change of wafer temperature can be controlled to acceptable levels that will not risk wafer distortion or wafer breakage. At later stages, pressure is varied accordingly to affect heat transfer coefficients to compensate for the lower heat driving force. In certain embodiments, the methods allow wafers to be moved closer to the heating or cooling source than what is typically considered reliable without causing thermally induced stresses. Because the wafer is now closer to the heating or cooling source and again with pressure manipulated to increase heat transfer, the rate of temperature change at the ending stages of the cycle can be increased to avoid excessive cycle time. As a result, the overall rate of heat transfer is improved.

These and other aspects and advantages of the invention are described in the detailed description which follows.

DETAILED DESCRIPTION

Figure 1:
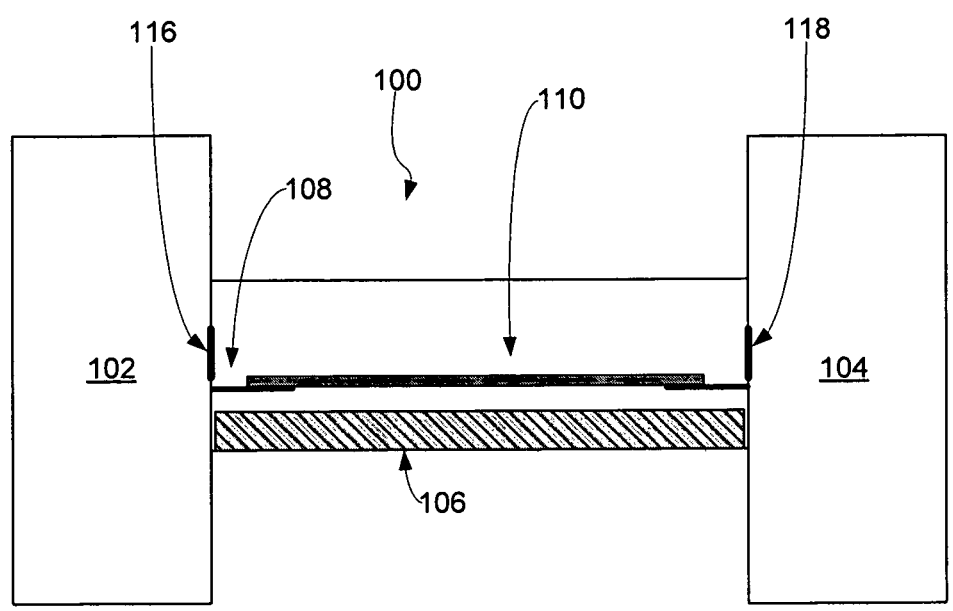
FIG. 1 is a schematic of a loadlock apparatus.

FIG. 1 shows a simplified schematic diagram of a loadlock apparatus 100 that separates an atmospheric environment 102 and a low pressure environment 104. In operation, a wafer or other substrate is transferred between the atmospheric environment and the low pressure environment via the loadlock. For example, a loadlock receives unprocessed or inbound wafers from the atmospheric environment to be transferred to a process chamber in low pressure environment and/or processed or outbound wafers from transfer module in the low pressure environment to be transferred back to a storage cassette at atmospheric pressure. The atmospheric environment typically contains an atmospheric robot that transfers wafers between the loadlock to a storage cassette, as well as fan filter unit to prevent contaminants from entering the atmospheric environment. The low pressure environment may contain one or more processing chambers as well as a transfer module (also called a vacuum transfer) robot that transfers wafers between the loadlock and the processing chamber.

A loadlock may be bidirectional (holding inbound and outbound wafers) or unidirectional (holding only inbound or only outbound wafers). In certain embodiments, the loadlocks are unidirectional. Inbound wafers are also referred to herein as incoming or unprocessed wafers; outbound wafers are also referred to herein as outgoing or processed wafers. Wafer transfer robots located on each side of the loadlock to transfer the wafers in and out of the loadlock: the atmospheric robot via aperature 116 and the vacuum transfer robot via aperature 118. The aperatures may be any type of doors or valves including gate valves, sliding doors, rotational doors, etc.

A wafer 110 is supported within the loadlock by wafer support 108. The wafer support any may be a pedestal, shelf, or other surface that supports the wafer in the loadlock. The support may also support an electrostatic chuck, a vacuum chuck or other chucking device to secure the wafer. In certain embodiments, a space under most of the wafer allows a robot arm to slide under to pick or place the wafer. Pins or other lift mechanism may also be present for vertical displacement of the wafer.

One or more gas inlets (not shown) allow venting of a gas into the loadlock to raise the pressure therein. Vacuum pumps (not shown) are used to pump down the loadlocks as necessary during operation via one or more gas outlets (not shown).

Heat transfer element 106 is a heat source, e.g., a resistive heater, or a heat sink, e.g., cooling channels. The heat transfer element facilitates the necessary heat transfer during the venting or pumping operation. Heat transfer takes place via conduction, convection and radiation, dominated by a combination of conduction and convection with a transfer gas from the wafer to the heat transfer element 106. The gap between the heat transfer element and the wafer support may be variable or fixed. In many embodiments, the gap is fixed during the heat transfer process, i.e., the loadlock geometry is static during heat transfer. Also in many embodiments, a pedestal acts as the heat transfer element, e.g., with resistive heating elements, cooling channels or other heat sources or sinks embedded within the pedestal. In these embodiments, the gap is between the pedestal and the wafer. If the wafer being transferred has film deposited on it, the wafer may be cupped or domed due to the tensile or compressive stress of the film. The wafer may also be distorted due to where and how it is supported, for example, supports that contact the wafer only on the back side edge (as shown in FIG. 1), may cause the wafer to sag in the middle. The pedestal may also be convex or concave, e.g., to promote uniform heating and cooling across the wafer. Pedestal profiles such as those described in U.S. patent application Ser. Nos. 11/129,266, filed on May 12, 2005 and 11/546,189, filed on Oct. 26, 2006, both of which are incorporated herein by reference for all purposes, may be used. Because the gap between the wafer and the pedestal or other heat source/sink may vary across the wafer due to convexity or concavity of the wafer and or pedestal, quantitative references herein to gap between the wafer and the heat transfer element typically refer to the average gap. The distance between the wafer support and the pedestal or other heating element surface also provides an indication gap across which heat is transferred.

To transfer a wafer from atmospheric environment 102 to low pressure environment 104, atmospheric aperature 116 opens and a wafer is transferred into the loadlock, which is also at atmospheric pressure. The aperature closes, sealing off the loadlock. Vacuum pumps are used to lower the pressure. In many embodiments, the wafer is heated during this operation using heating transfer element 106. Once the pressure is sufficiently low, aperature 118 opens and the wafer is transferred out. To transfer a wafer from the low pressure environment 104 to the atmospheric environment 102, a wafer is placed into an outbound loadlock also at low pressure via aperature 118. The outbound wafer, having come from a processing chamber, is typically at a raised temperature. The aperature closes, sealing the loadlock. Gas is vented into the chamber to raise it to atmospheric pressure, while heat is transferred from the wafer to heat transfer element 106, in this case a heat sink, to cool it. Once the chamber pressure is raised to atmospheric pressure and the wafer is sufficiently cooled, atmospheric aperature 116 opens and the wafer is transferred out.

Many open loop wafer heating or cooling systems suffer from wafer distortion and excessive delays due to the rate of heat transfer varying from initial to ending conditions. At the initial conditions when differential temperatures are high, excessive heat transfer can occur, which can lead to wafer distortion. At ending conditions when differential temperatures are low, the rate of heat transfer suffers, causing excessive delays. Many wafer heating or cooling systems are designed to operate at a single pressure with a single geometry between the source and wafer. These systems must compromise wafer distortion against excessive time delays. In order to reduce thermally induced stresses, the gap between the wafer and the source is typically between 15-50 mils in conventional systems. As indicated above, and discussed further below, in certain embodiments, the methods herein allow smaller gaps, e.g., on the order of 2-20, or 2-10, mils to be used.

Figure 2:
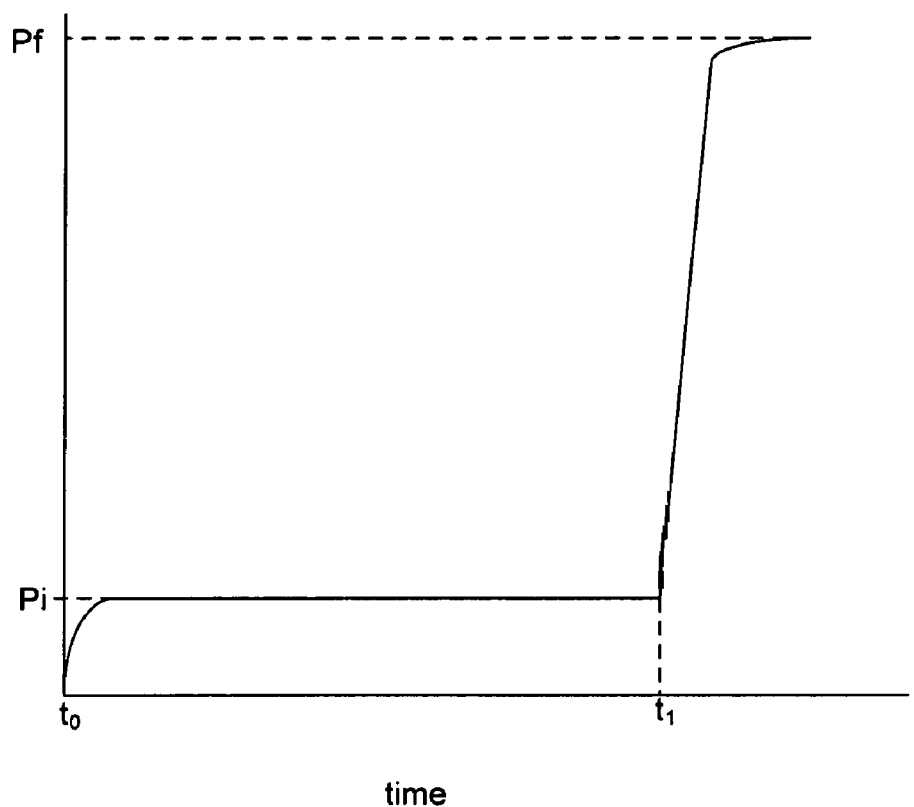
FIG. 2 is a graph showing loadlock pressure as a function of time during a conventional loadlock vent cycle.

FIG. 2 shows a graph illustrating the loadlock chamber pressure versus time according to conventional method. The wafer is placed in the loadlock and the loadlock is sealed at time $t_0$. The chamber is then flooded with a heat transfer gas, e.g., helium, to bring the pressure to Pi. Pi is an intermediate pressure level between 0 and 1 atm or other final pressure; for example Pi may be 0.5 atm. The chamber sits at this pressure until $t_2$, which is determined by the desired final temperature. The chamber is then fully vented to bring it to the final temperature, Pf, e.g., 1 atm. This results in bulk cooling, with most of the heat transferred during the period the wafer sits in the chamber at Pi. Beyond a threshold level, the Pi level may vary widely without a significant change in the overall heat transfer time. The pressure level Pi is high enough to give the maximum effect of the heat transfer gas, i.e., raising the pressure does not increase heat transfer rate.

Figure 3:
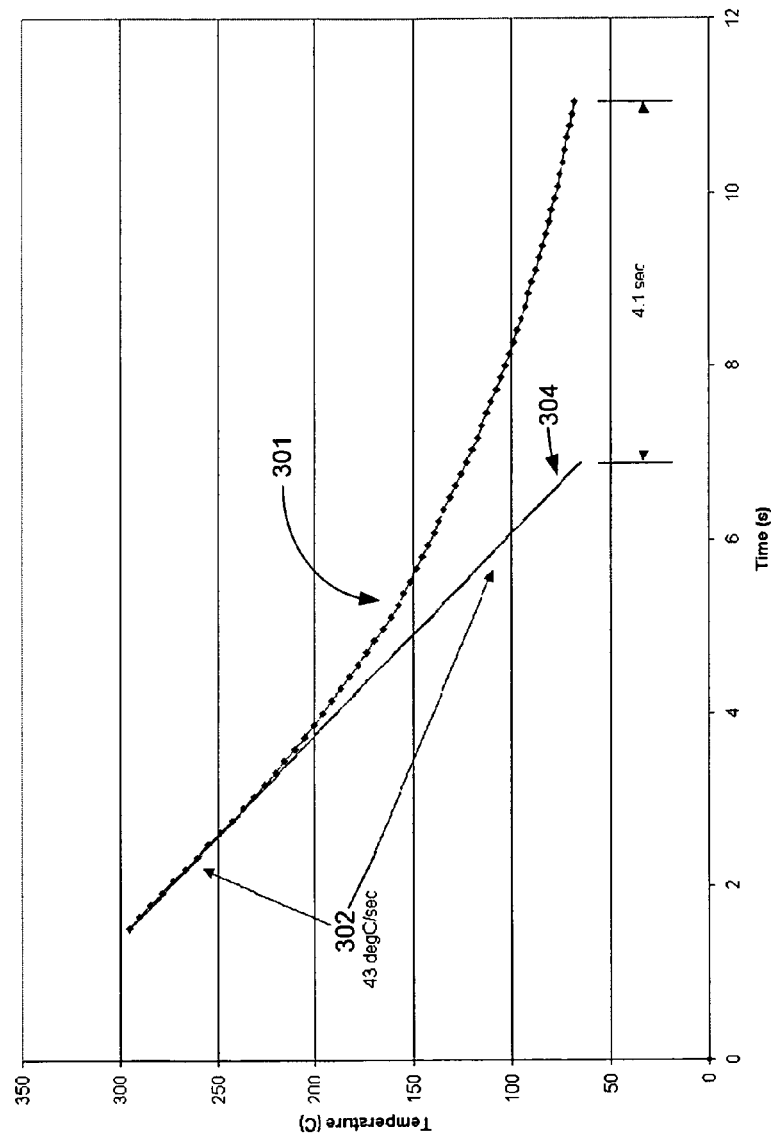
FIG. 3 is a graph comparing wafer temperature as a function of time for a loadlock vent cycle according to an embodiment of the invention with that of a conventional loadlock vent cycle.

FIG. 3 is a schematic showing temperature of a wafer versus time during a cooling and vent cycle. The dotted line 301 indicates temperature of a wafer using a prior art method, such as shown in FIG. 2, with $t_1$ shown in FIG. 2 being 11 seconds. Cooling at the beginning of the cooling cycle is aggressive, as indicated by the slope at 302 of 43° C./sec. The rate of heat transfer, Q, is given as: Q=(T1–T2)L, where T1 is the temperature of the wafer, T2 is the heat sink temperature and L is the heat transfer coefficient. Because L is constant for constant pressure, as the temperature difference decreases, the rate of heat transfer decreases in a conventional method. This is shown in FIG. 3 by line 301, with the slope of line 301 lessening as the process goes on.

The methods described herein use a variable heat transfer coefficient. Controlling the amount of gas inlet to the chamber closely allows fine control of the heat transfer coefficient and the rate of heat transfer. In this manner, aggressive cooling can take place throughout the entire cooling cycle, and not just at the beginning. Line 304 shows temperature of a wafer versus time according to an embodiment of the invention in which the rate of heat transfer is constant. Cooling is aggressive at the beginning of the transfer period, just as with the prior art method. Unlike the prior art methods, however, cooling remains aggressive, such that the rate of heat transfer is constant or near constant, as shown by the straight line in FIG. 3. As a result, the time to cool the wafer is decreased. In the example shown in FIG. 3, both methods result in an initial cooling rate of 43° C./sec for a wafer at almost 300° C. Heat transfer slows for the conventional method as shown by the decreasing slope of line 301, while it stays at 43° C./sec for the variable heat transfer coefficient method. This results in a difference of over 4 seconds to cool the wafer to just over 50° C.

The rate of heat transfer indicated by the slope at 302 is an allowable rate without risking thermally induced stresses that would break the wafer. In certain embodiments, the methods described herein allow the rate of heat transfer to be maintained during the later stages of a cooling (or heating) cycle by using a smaller gap between the wafer and the heat transfer element than conventionally used. With current methods, raising the pressure later in later stages does not significantly affect the rate of heat transfer as the maximum cooling effect that helium (or other heat transfer gas) can give has already been reached.

However, using the methods of the invention, the wafer can be moved closer to the heating or cooling source than what is typically considered reliable (due to thermal induced stresses). By manipulating the gas pressure accordingly, the rate of heat transfer is reduced selectively in the initial stages of a heating or cooling cycle. By doing this, the rate of change of wafer temperature can be controlled to acceptable levels that will not risk wafer distortion or wafer breakage. At later stages, pressure is raised or otherwise varied accordingly to affect heat transfer coefficients to compensate for the lower heat driving force ($\Delta T$). Because the wafer is now closer to the heating or cooling source the rate of temperature change at the ending stages of the cycle can be increased to avoid excessive cycle by manipulating the pressure to increase heat transfer. The methods of the invention allow rapid heat transfer without wafer breakage: by softening the initial cooling rate, a more aggressive cooling design can reduce the overall time of cooling.

Pressure is typically varied in the chamber by controlling the flow (and/or partial pressure) of a heat transfer gas in the chamber. In certain embodiments, helium is used as the heat transfer gas. Embodiments of the invention are based on the recognition that the thermal properties of helium allow for variable heat transfer coefficients at low pressures. As noted above, increasing the pressure of helium above a certain level in a chamber does not appreciably increase the rate of heat transfer. This level depends on the temperature, geometries and gap sizes, but it is generally around 100 Torr. However, at low pressure and with loadlock geometries used such as described above, helium's thermal conductivity varies non-linearly with pressure. This allows fine control of the heat transfer coefficient and rate of heat transfer by varying the helium pressure. The pressure in the loadlock may be varied by controlling the amount of gas in the chamber. The heat transfer gas may be continuously flowed over one or more periods of time during the heating or cooling cycle, or it may be pulsed at certain intervals.

Figure 4:
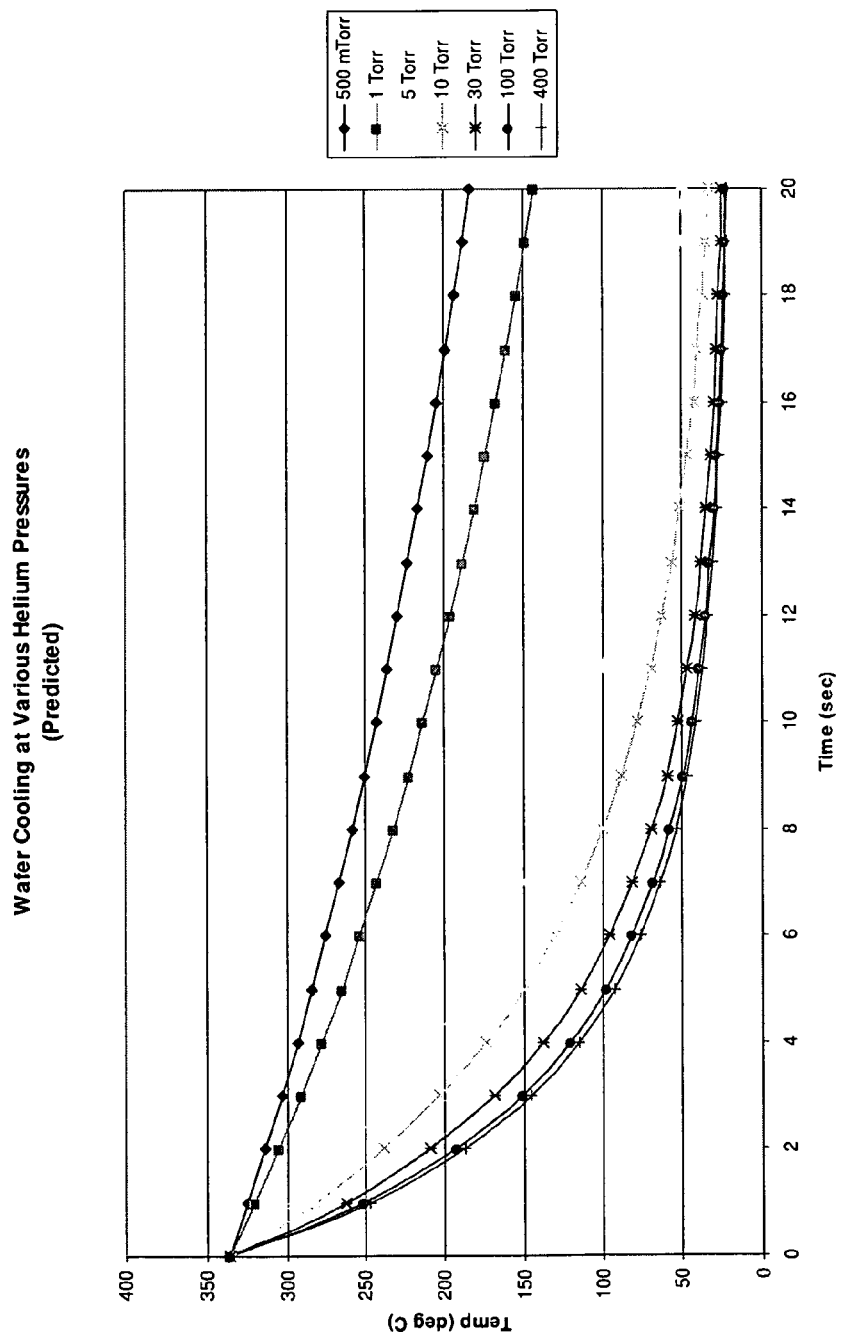
FIG. 4 is a graph showing wafer temperature as a function of time for various helium pressures during a cooling cycle in a loadlock.

FIG. 4 shows wafer cooling for various helium pressures. As indicated above, in conventional methods, the bulk of the heat transfer is achieved at a single pressure, e.g., P1 in FIG. 2. FIG. 4 shows that cooling rate increases with high pressures but that above a certain pressure, the cooling rate does not increase. Substantially the same cooling rate is achieved at 100 Torr as at 400 Torr, as shown in FIG. 4. The data shown in FIG. 4 is applicable to wafer cooling with gaps of about 5-50 mils to the heat sink or source.

Figure 5:
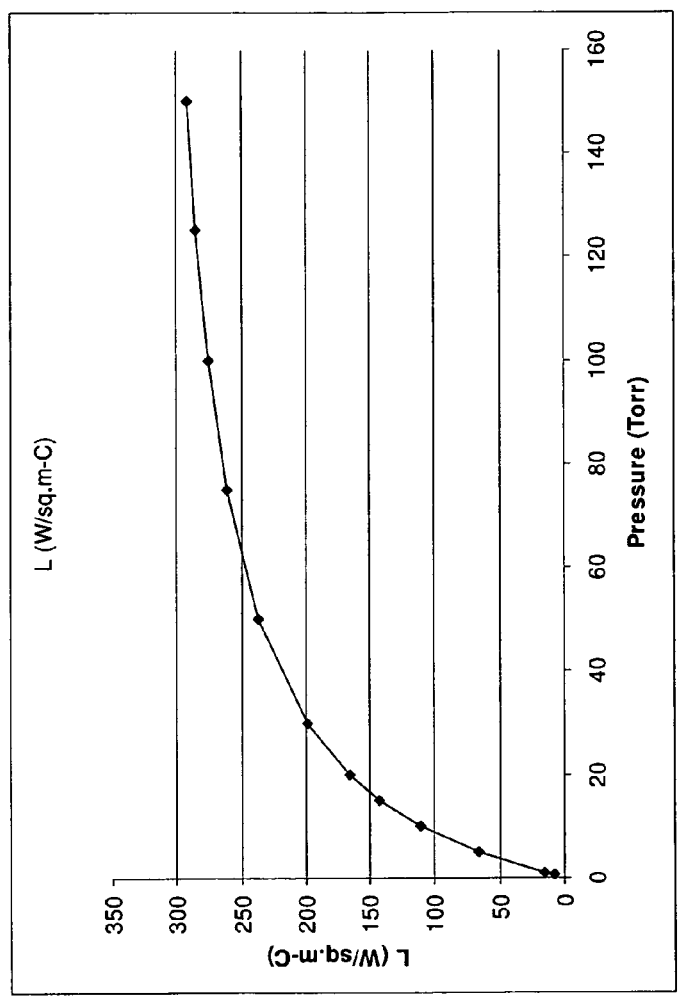
FIG. 5 is a graph showing heat transfer coefficient of helium as a function of helium pressure for certain loadlock geometries.

FIG. 5 shows the pressure dependence of the heat transfer coefficient, L, at low pressures for wafer cooling with a 25 mil gap between the wafer and pedestal. As can be seen, the heat transfer coefficient varies non-linearly with pressure at these pressures. As discussed above, in embodiments described herein, the rate of heat transfer is kept constant or near constant (e.g., varying by no more than 10%), by varying the heat transfer coefficient to compensate for the reducing temperature difference between the wafer and the heat source or sink. This is done by varying the pressure in accordance with the relationship shown in FIG. 5 (and the changing $\Delta T$) to achieve the heat transfer coefficient vs. time curve necessary to keep the rate of heat transfer constant. In the perfect case, the rate of change of temperature would be constant. In that case the heat transfer coefficient should vary as a function of the difference in temperature. And then the using the non linear relationship between heat transfer coefficient and pressure, the pressure should vary accordingly. Thus, the general shape of the pressure curve would be similar but inverted to the heat transfer coefficient. The relationship shown in FIG. 5 was derived from theoretical calculations of heat transfer from a hot silicon wafer and a cold plate, with a 15 mil gap between the wafer and the cold plate. Aspects of the curve shown in FIG. 5, can however, be generalized to wafer cooling in loadlocks with gaps of between about 15-25 mils between the wafer and the heat sink. In particular, the curve flattens out around 100 Torr, i.e., the pressure dependence of the heat transfer coefficient decreases at about 100 Torr. This is consistent with FIG. 4, which shows that the rate of heat transfer does not appreciably increase with increasing pressure above about 100 Torr. The greatest rate of change occurs between about 5 and 50 Torr, and more particularly between about 5 and 30 Torr or 5 and 20 Torr.

Figure 6A:
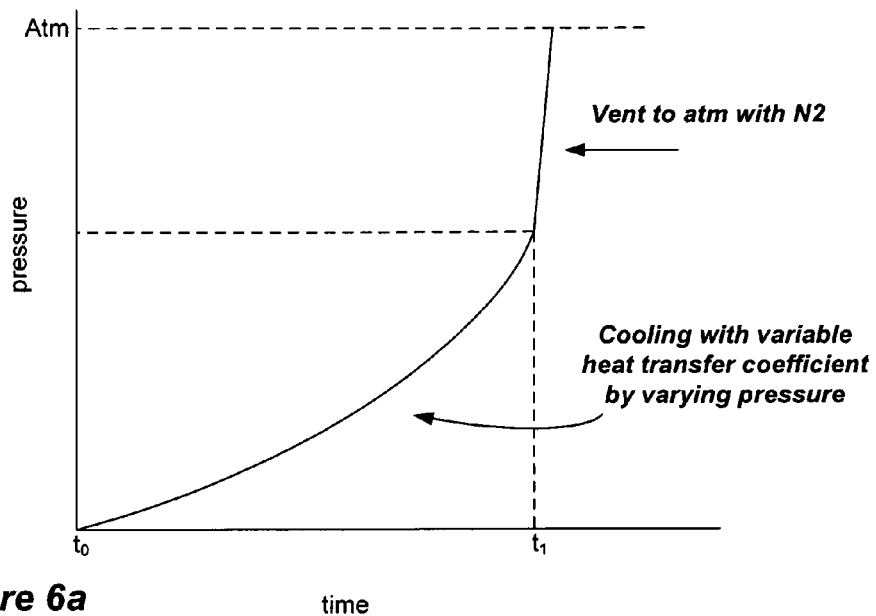
FIGS. 6a-6c are graphs illustrating loadlock pressure as a function of time during vent and cooling cycles according to various embodiments.

In certain embodiments, the pressure is modulated throughout the cooling process. FIG. 6a shows an example of vent cycle with variable pressure. As shown, pressure is varied throughout the process, until a time $t_1$ at which the chamber is vented to atmospheric pressure. The bulk cooling occurs between $t_0$ and $t_1$, with a constant rate of heat transfer. Nitrogen is typically used to vent to atmospheric, as it is less costly than helium. (Some amount of heat transfer may occur during the $N_2$ vent, though most of the temperature change occurs prior to it).

In certain embodiments, the methods involve stepping the pressure up in one or more stages. The theoretically perfect pressure versus time curve that results in a perfectly constant rate of cooling may be approximated in this manner to achieve a temperature curve that is more linear than the single stage conventional heat transfer techniques. In certain embodiments, the rate of heat transfer is approximately constant during the bulk cooling period, or varies by no more than 1%, 5%, 10% or 20%. This is in contrast to conventional heating and cooling in loadlocks, in which the rate of heat transfer typically varies by at least significantly more, e.g., as much as 90% or even as high as 99%.

Figure 6B:
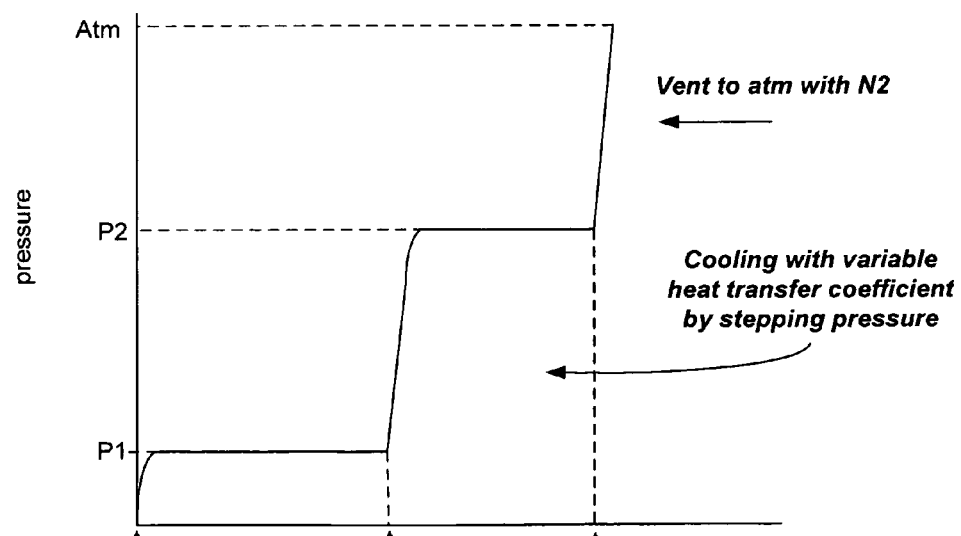
Figure 6C:
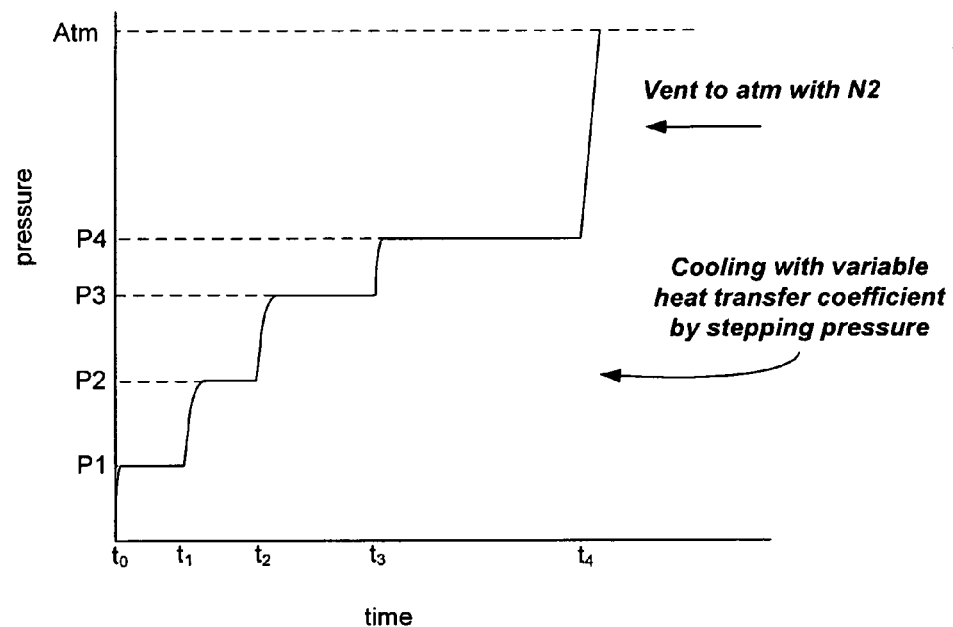

FIGS. 6b and 6c show schematic diagrams of pressure vs. time during vent cycles wherein the pressure is stepped up in stages. FIG. 6b shows a process in which cooling is accomplished during the vent cycle by delays at two pressures, P1 and P2. First, pressure is brought to P1 with the introduction of a heat transfer gas. The chamber pressure is held there until t1, at which point, the pressure is stepped up to P2, e.g., by introducing another pulse of the heat transfer gas. The chamber pressure is held there until t2, at which point the chamber is vented up to atmosphere. As in the process described in FIG. 2, the wafer is completely or nearly completely cooled by t2, prior to venting to atmosphere. In contrast to the conventional method illustrated in FIG. 2, however, there are two intermediate pressures. The first intermediate pressure is at a pressure below that which results in the maximum heat transfer coefficient. In certain embodiments in which a wafer is being cooled by a cold plate at a gap of between about 5-50 mils, this is at less than about 100 Torr, and in particular embodiments, between about 5 and 50 Torr or 5 and 30 Torr. As described below, with reference to FIG. 7, in certain applications and process conditions, using a two stage process provides a significant improvement over the conventional improvement in reducing variation in the heat transfer rate, and the cooling time. In certain embodiments, more stages may be used to better approximate the theoretic ideal. FIG. 6c shows a graph illustrating the loadlock chamber pressure versus time according to conventional method. In the embodiment shown in FIG. 6c, there are delays at intermediate pressures P1, P2, P3 and P4. For these staged vents, the final pressure prior to venting to atmosphere (i.e., P2 in FIG. 6b and P4 in FIG. 6c) is typically at or above a pressure at which the thermal conductivity does not change significantly, with the pressures of the previous stages (P1 in FIG. 6b and P1, P2 and P3 in FIG. 6c) typically below this level. Referring back to FIG. 5, the final pressure is above about 100 Torr (the point at which the L vs. P curve flattens), with the lower pressures below this level. In certain embodiments, the delays (e.g., P1, P2 and P3) are at pressures in the range in which the heat transfer coefficient changes most rapidly. In certain embodiments this, is between about 5-50 Torr, and more particularly between about 5-30 or 5-20 Torr, for example as shown in FIG. 5.

Figure 6D:
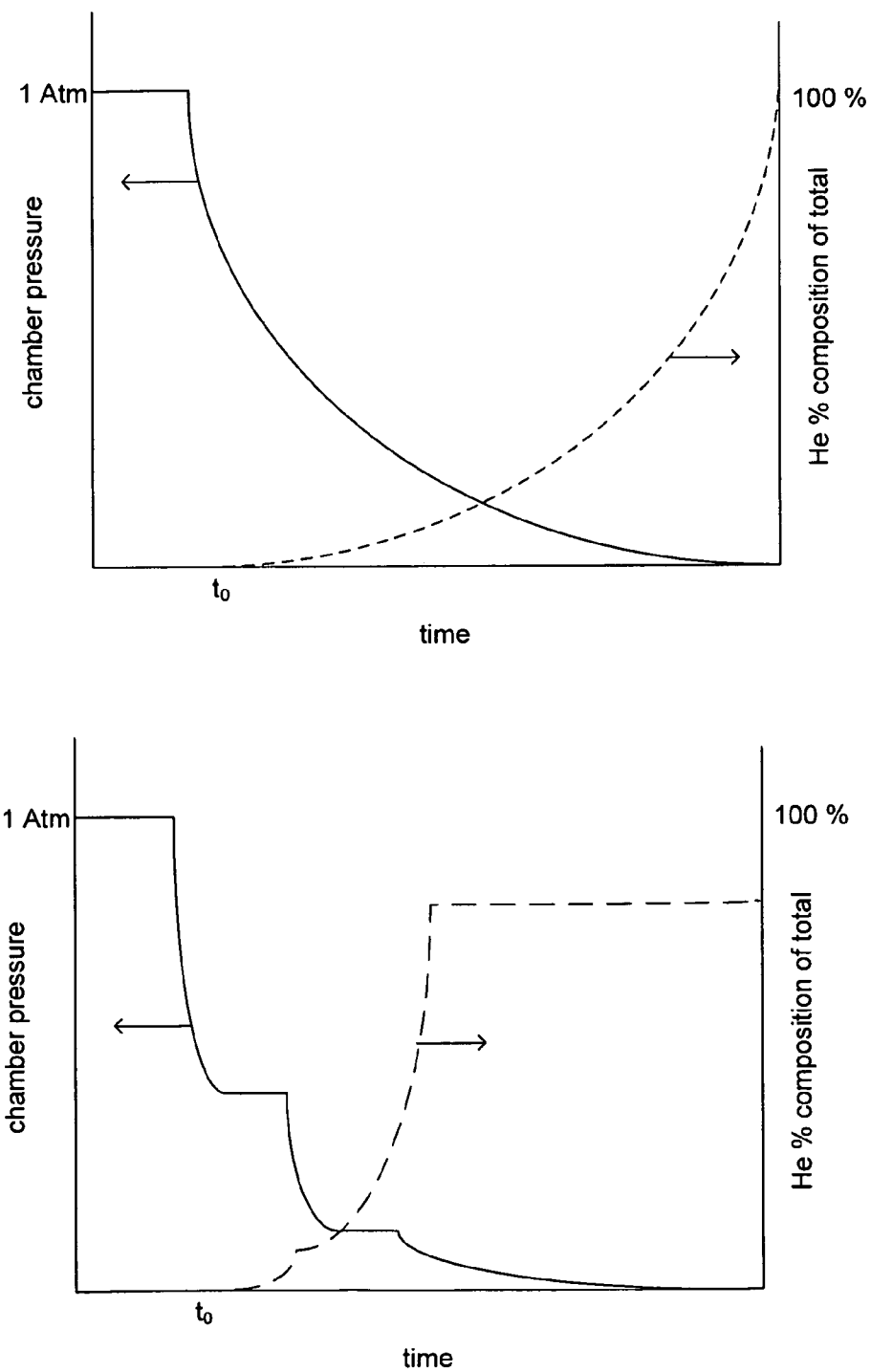
FIG. 6d shows graphs illustrating loadlock pressure and gas composition as function of time during pump down cycle according to various embodiments.

In certain embodiments, the methods described herein involve heating, rather than cooling, a wafer. In particular embodiments, the heating takes place during a pump down cycle, rather than a vent cycle. In this case, pressure is varied to maintain aggressive heating throughout the pump down cycle; however, as the chamber pressure decreases during the pump down cycle, the partial pressure of the heat transfer gas (e.g., helium) can be varied to vary the heat transfer coefficient. FIG. 6d shows schematic diagrams of two examples of pressure vs. time curves for a pump-down cycle: the solid lines show overall chamber pressure as it is pumped down from atmospheric to a low pressure, e.g., 500 mTorr and the dotted lines show the % composition of the heat transfer gas—in this case helium. At the t=0, the pressure is high and heat transfer coefficient is high. As in the wafer cooling case, the rate of heat transfer is established in this initially aggressive heating stage. In order to prevent distortions from thermally induced stress, the ratio of $N_2$ to He is high. As the pressure drops, the heat transfer coefficient drops and the amount of He is increased to keep the rate of heat transfer constant. By the end of the cycle, the pressure is low and the gas within the chamber is mostly helium. As with the vent cycles, the helium may be continuously introduced or pulsed in. An example of the former is shown in the top of FIG. 6d, and the latter in the bottom of FIG. 6d. The schematics shown in FIG. 6d are theoretical examples of pressure and composition curves; total pressure and gas composition curves in pump down cycles according to certain embodiments may also take other forms.

In certain embodiments, cooling may take place during a pump down cycle and/or heating may take place during a vent cycle. Regardless of the initial and final chamber pressures and the direction of the heat transfer, the principles described herein may be used to maintain the maximum allowable heat transfer rate by varying the heat transfer coefficient in a static loadlock geometry by varying the partial pressure of the heat transfer gas. The methods may also involve heating or cooling in modules other than loadlocks, for example, in a small process module. In an example of heating a wafer in such a module, a wafer may be placed near a hot platen at low pressure. The pressure is then varied, e.g., stepped up, to vary the heat transfer coefficient and maintain an aggressive rate of heat transfer.

The methods described herein may be applied to increase the overall rate of heat transfer by modulating the heat transfer coefficient in loadlock and other modules. In particular embodiments, the methods are used for loadlocks in which the gap between the wafer support and pedestal or other heating element is static during heat transfer. In particular embodiments, the gap ranges from about 0.005 inches to 0.1 inches—a range in which the pressure dependence of the heat transfer coefficient has been found to vary widely at low pressures as discussed above with respect to FIG. 5. As indicated, while the discussion herein has focused on loadlocks, the same methods may be applied to other modules. Any heat transfer gas may be used, though in particular embodiments, helium is used as it has a high thermal conductivity. Examples of other gases that may be used include nitrogen, hydrogen, argon and neon. In particular, gases that have heating characteristics that are sensitive to pressure may be used.

Figure 10:
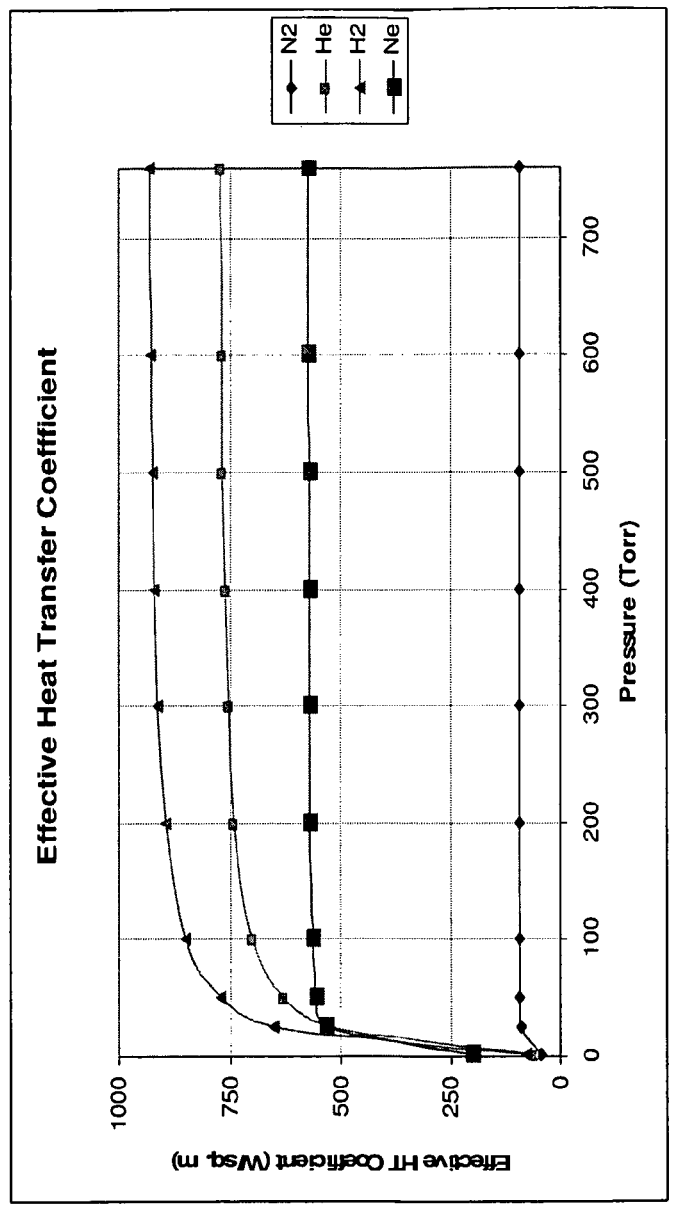
FIG. 10 is a graph showing an effective heat transfer coefficient for various heat transfer gases.

In particular embodiments, the effective heat transfer coefficient of the heat transfer gas is at least 10 W/m² at 300° C., and in particular embodiments, at least 750 W/m² at 300° C. at atmospheric pressure. FIG. 10 shows effective heat transfer coefficients for hydrogen, helium, neon and nitrogen. Because of the nature of the geometries in a loadlock, specifically less than 0.050" gap, the heat transfer mechanism is not purely conductive or convective, but a mixture of the two. The effective heat transfer takes into account both conduction and convection. As can be seen from the figure, nitrogen is the least effective of these at heat transfer. In many embodiments, helium or another gas is used as the heat transfer gas, with nitrogen used to complete the vent cycle after the bulk cooling is performed.

EXPERIMENTAL

A wafer in a vacuum environment was placed in a loadlock having a pedestal for venting and cooling from about 380° C. to about 60° C. The wafer was positioned within the loadlock chamber at a gap of about 15 mils from the pedestal. The initial conditions in the loadlock chamber were a chamber pressure of 500 mTorr (100% $N_2$). At time t=0, helium was pulsed into the loadlock using a high flow rate valve to bring chamber pressure to about 7 Torr, nearly instaneously (He was flowed for about 30 msec to get to 7 Torr). At this point, the gas composition in the loadlock was about 95% He/5% $N_2$. The wafer was cooled at 7 Torr for 3 seconds, at which point He was pulsed to reach a chamber pressure of 200 Torr—well over the pressure required to achieve the maximum cooling effect possible with helium. The wafer was cooled at 200 Torr for 6 secs. At time t=9 seconds, the loadlock was vented to atmosphere with $N_2$.

Figure 7:
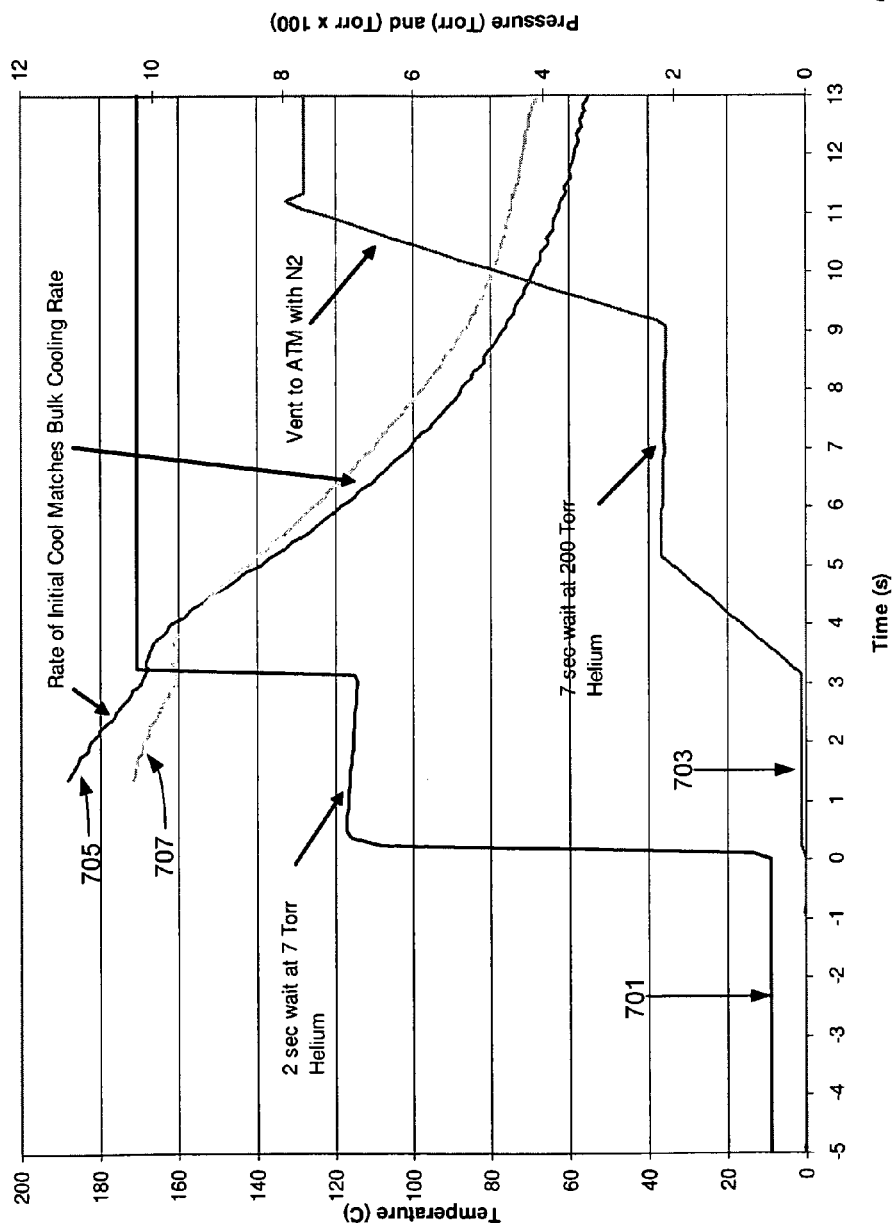
FIG. 7 is a graph showing wafer temperature and chamber pressure as a function of time for a wafer cooling and vent cycle performed according to an embodiment described herein.

FIG. 7 is a graph showing chamber pressure and wafer temperature as a function of time. Pressure is indicated on the right vertical axis, with curve 701 showing chamber pressure as measured with a 10 torr manometer, and curve 703 showing chamber pressure as measured with a 100 Torr manometer. Temperature is indicated on the left vertical axis, with curve 705 showing wafer temperature as measured at the center of the wafer, and curve 707 showing wafer temperature as measure at the edge of the wafer. Note that there is a slight delay in the reported temperature (as shown on the graph) versus the actual wafer temperature. Significantly, the slope of cooling curve 705 during the initial cooling period is approximately the same as its slope during the bulk cooling period.

Figure 8:
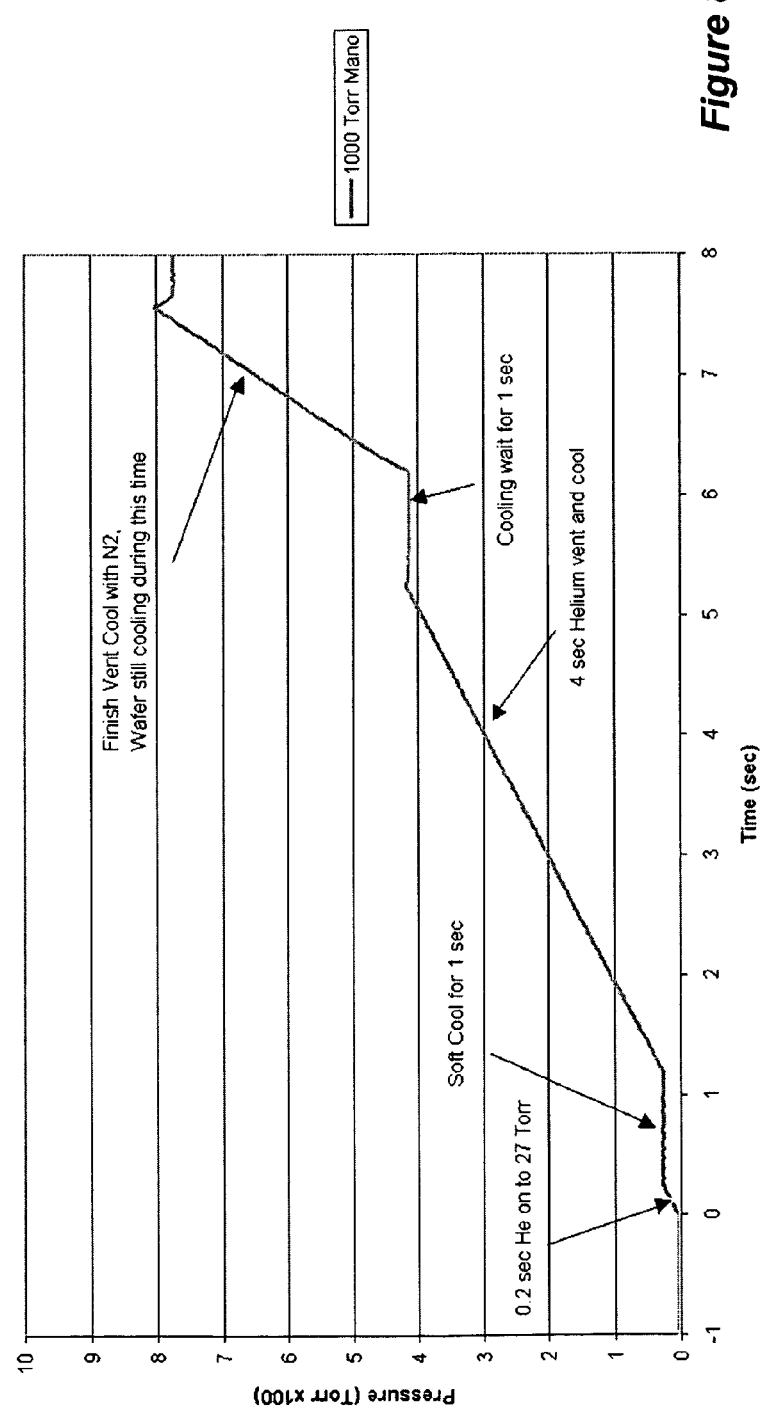
FIG. 8 is a graph showing chamber pressure as a function of time for a wafer cooling and vent cycle performed according to an embodiment described herein.

FIG. 8 is a graph shown chamber pressure vs. time in another example of a vent cycle according to an embodiment of the invention. Here, the pressure is held at 27 Torr for 1 sec, then raised to about 400 Torr, where it is held for 4 secs. This is the bulk cooling period. $N_2$ is then inlet to the chamber to vent to atmospheric. As indicated on the graph, some amount of cooling may occur during this period, though most of the heat is transferred prior to the vent to atmospheric pressure.

Apparatus

Figure 9:
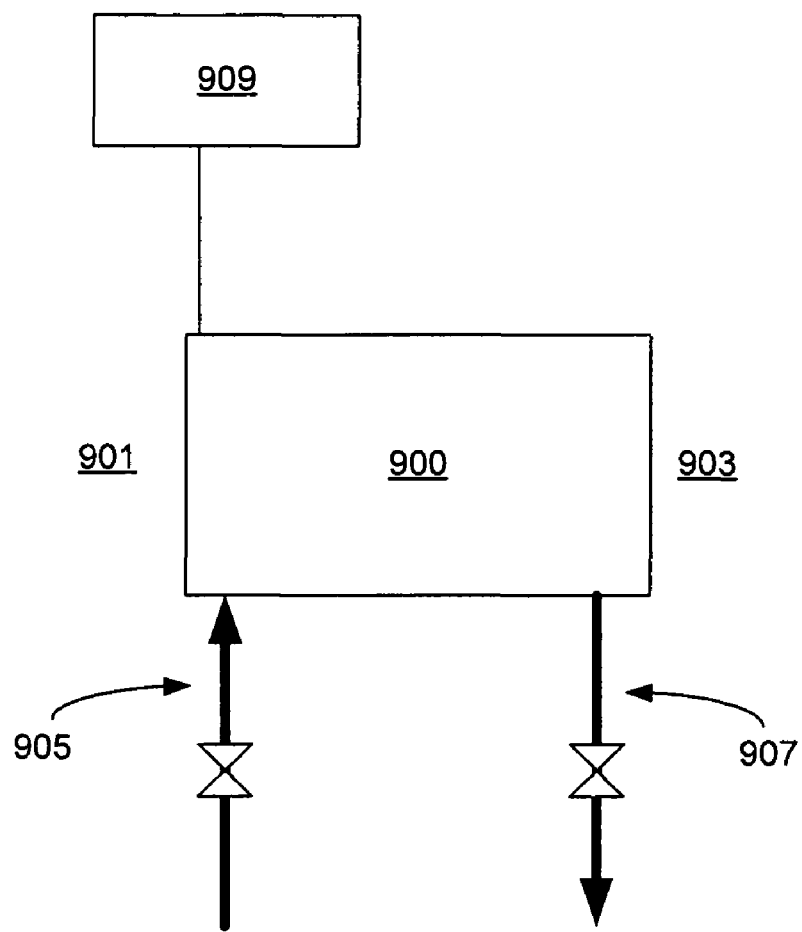
FIG. 9 is a block diagram showing various components of a loadlock system that may be used in accordance with the methods described herein.

FIG. 9 provides a simple block diagram depicting various components arranged for implementing the present invention. Loadlock 900 is located between atmospheric environment 901 and low pressure environment 903. Controller 909 may be connected to components of the loadlock system and control the inlet gas composition, gas inlet and/or outlet flowrates, chamber pressure, heat transfer element temperature as well as timing of the pressure variation operations. Machine-readable media may be coupled to the controller and contain instructions for controlling timing and/or process conditions for the venting or pumpdown cycles in the loadlock. Gases are introduced via inlet or inlets 905. Multiple gas source lines may be employed, e.g., for helium and nitrogen. The gases may be premixed or not. Appropriate valving and mass flow control mechanisms are employed to ensure that the correct gases and flow rates are delivered. Gases exit the loadlock via an outlet or outlets 907. A vacuum pump may be employed to pump gas out during a pump down operation, e.g., using a controlled flow restriction device, such as a throttle valve or a pendulum valve.

The controller will typically include one or more memory devices and one or more processors. The processor may include a CPU or computer, analog and/or digital input/output connections, stepper motor controller boards, etc. In certain embodiments, the controller controls the heat transfer gas inlet timing sequences throughout a venting or pump down cycle. The controller may also control some or all of the other activities of the loadlock deposition apparatus. The system controller executes system control software including sets of instructions for controlling the timing, flow rate and composition gases, chamber pressure, pedestal temperature, wafer temperature, chuck or pedestal position, and other parameters of a particular process. Other computer programs stored on memory devices associated with the controller may be employed in some embodiments. Typically there will be a user interface associated with controller 909. The user interface may include a display screen, graphical software displays of the apparatus and/or process conditions, and user input devices such as pointing devices, keyboards, touch screens, microphones, etc. The computer program code for controlling the timing and other process conditions in a process sequence can be written in any conventional computer readable programming language: for example, assembly language, C, C++, Pascal, Fortran or others. Compiled object code or script is executed by the processor to perform the tasks identified in the program. The controller parameters relate to process conditions such as, for example, heat transfer gas composition, flow rates, and timing profiles, other vent gas composition, flow rates and timing profiles, chamber pressure, pump down rates, pedestal temperature, etc. These parameters are provided to the user in the form of a recipe, and may be entered utilizing the user interface. Signals for monitoring the process may be provided by analog and/or digital input connections of the system controller. The signals for controlling the process are output on the analog and digital output connections of the deposition apparatus. The system software may be designed or configured in many different ways. For example, various loadlock component subroutines or control objects may be written to control operation of the chamber components necessary to carry out the inventive vent and pump down processes. Examples of programs or sections of programs for this purpose include substrate positioning code, inlet gas control code, heat transfer gas control code, vent gas control code, pumping control code and heat temperature control code.

A process gas control program may include code for controlling gas composition, flow rates and timing. Examples of chamber sensors that may be monitored prior to, during or after a vent or pump down cycle include mass flow controllers, pressure sensors such as manometers, and thermocouples located in the pedestal or chuck or near the wafer. Appropriately programmed feedback and control algorithms may be used with data from these sensors to maintain desired process conditions and or to initialize processes. For example, pressure and temperature measurements may be used to increase pressure of a heat transfer gas to keep the rate of heat transfer constant or near constant. In other embodiments, timing of pulses or flow rate of the heat transfer gas may be predetermined as in the examples described above.

While this invention has been described in terms of a few preferred embodiments, it should not be limited to the specifics presented above. Many variations on the above-described preferred embodiments may be employed. Therefore, the invention should be broadly interpreted with reference to the following claims.

The invention claimed is:

1. A method of transferring heat to or from a substrate in an air-tight chamber, said air-tight chamber containing a substrate support and a heat transfer element, said substrate support configured to support the substrate at a distance above the heat transfer element such that a thermally conductive heat transfer gas can flow between the supported substrate and the heat transfer element, the method comprising:
transferring heat between the wafer and the heating element to bring the wafer from a first temperature to a second temperature during a bulk heat transfer operation,
wherein transferring heat during the bulk heat transfer operation comprises varying the heat transfer coefficient of the thermally conductive heat transfer gas by varying the partial pressure of the thermally conductive heat transfer gas.

2. The method of claim 1 wherein the distance between the bottom surface of the substrate and the heat transfer element is between about 2-200 mils.

3. The method of claim 2 wherein the distance is between the bottom surface of the substrate and the heat transfer element is between about 2-15 mils.

4. The method of claim 1 wherein the thermally conductive gas is helium.

5. The method of claim 1 wherein the substrate is a partially fabricated semiconductor substrate.

6. The method of claim 1 further comprising, after the bulk heat transfer operation, venting or pumping down the chamber to bring it to a final pressure.

7. The method of claim 1 wherein the varying the partial pressure of the thermally conductive heat transfer gas during the bulk heat transfer operation comprises inletting the heat transfer gas to the chamber throughout the bulk heat transfer operation.

8. The method of claim 1 wherein varying the partial pressure of thermally conductive heat transfer gas during the bulk heat transfer operation comprises inletting a first amount of the thermally conductive heat transfer gas to the chamber to bring the partial pressure of the thermally conductive heat transfer gas to a first intermediate level, maintaining the partial pressure at the first intermediate level for a specified first time period, inletting a second amount of the thermally conductive gas to the chamber to bring the partial pressure to a second intermediate level and maintaining the partial pressure of the thermally conductive gas at the second level for a specified period of time.

9. The method of claim 1 wherein varying the partial pressure of the thermally conductive heat transfer gas comprises sequentially raising the partial pressure to a plurality of intermediate levels, wherein the partial pressure at each level is maintained for a specified period of time.

10. The method of claim 9 wherein the last of the plurality of sequential levels is greater than about 100 Torr and each of the other levels is below about 100 Torr.

11. The method of claim 1 wherein the rate of heat transfer varies by no more than about 30% during the bulk heat transfer operation.

12. The method of claim 1 wherein the rate of heat transfer varies by no more than about 20% during the bulk heat transfer operation.

13. The method of claim 1 wherein the rate of heat transfer varies by no more than about 10% during the bulk heat transfer operation.

14. A method of cooling a partially fabricated semiconductor device substrate in a loadlock during a vent cycle, said method comprising:

positioning the substrate in the loadlock such that the substrate is at distance d from a heat sink within the loadlock, wherein said substrate is at average temperature $T_1$ during introduction; introducing a thermally conductive heat transfer gas to the loadlock; cooling the substrate from $T_1$ to a temperature $T_2$ during a bulk heat transfer operation; and varying the heat transfer coefficient of the thermally conductive heat transfer gas during the bulk heat transfer operation to thereby reduce the time-dependent variation of the rate of heat transfer from the substrate to the heat sink during the bulk heat transfer operation.

15. The method of claim 14 wherein the distance d is between about 5 and 50 mils.

16. The method of claim 14 wherein the varying the heat transfer coefficient comprises varying the partial pressure of the heat transfer gas.

17. The method of claim 16 wherein varying the partial pressure of the heat transfer gas comprises maintaining the partial pressure of the heat transfer gas at least one first intermediate level between 5 and 50 Torr for a period of time and maintaining the partial pressure of the heat transfer gas at at least one second intermediate level greater than 100 Torr for a period of time.

18. A method of cooling a partially fabricated semiconductor device substrate in a loadlock during a vent cycle from a temperature $T_1$ to a temperature $T_2$; said method comprising:

positioning the substrate in the loadlock such that the substrate is at distance between 5 and 50 mils from the top surface of a pedestal having cooling channels within the loadlock;

sealing the loadlock so that it is air-tight;

introducing a small amount of helium into the loadlock to raise the chamber pressure within the loadlock to a level between about 5 and 30 Torr and maintaining the chamber pressure at that level for a time period;

introducing an amount of helium into the loadlock to raise the chamber pressure to a level between about 100-500 Torr and maintaining chamber pressure at that level for a time period sufficient such that the substrate is substantially cooled to the temperature $T_2$; and introducing nitrogen into the loadlock to thereby raise the chamber pressure to atmospheric pressure.

* * * * *